United States Patent [19]

Oldham

[11] Patent Number: 5,563,835
[45] Date of Patent: Oct. 8, 1996

[54] SENSE AMPLIFICATION IN DATA MEMORIES

[75] Inventor: Harry E. Oldham, Cambridge, United Kingdom

[73] Assignee: Advanced Risc Machines Limited, Cambridge, United Kingdom

[21] Appl. No.: 379,012

[22] Filed: Jan. 27, 1995

[30] Foreign Application Priority Data

Jan. 31, 1994 [GB] United Kingdom ............... 9401781
Jan. 31, 1994 [GB] United Kingdom ............... 9401803

[51] Int. Cl.⁶ .................................................. G11C 7/02
[52] U.S. Cl. ................ 365/207; 365/203; 365/189.05; 327/52
[58] Field of Search ...................................... 365/207, 203, 365/189.05; 327/359, 52

[56] References Cited

U.S. PATENT DOCUMENTS

| | | | |
|---|---|---|---|
| 4,903,237 | 2/1990 | Rao | 365/185 |
| 4,972,374 | 11/1990 | Wang et al. | 365/205 |
| 5,007,024 | 4/1991 | Tanaka et al. | 365/206 |
| 5,058,073 | 10/1991 | Cho et al. | 365/205 |
| 5,272,674 | 12/1993 | Pathak et al. | 365/206 |
| 5,325,328 | 6/1994 | Muroya et al. | 365/189.05 |
| 5,329,494 | 7/1994 | Suzuki et al. | 365/203.03 |
| 5,333,127 | 7/1994 | Hiraki et al. | 365/207 X |
| 5,347,183 | 9/1994 | Phelan | 365/207 X |

FOREIGN PATENT DOCUMENTS

0604195A2  6/1994  European Pat. Off. .......... G11C 7/06

*Primary Examiner*—David C. Nelms
*Assistant Examiner*—Huan Hoang
*Attorney, Agent, or Firm*—Albert C. Smith

[57] ABSTRACT

A data memory includes a memory cell that operates to generate two complementary data outputs indicative of a data bit stored in the memory cell. First and second sense amplifiers set an output latch to a first output logic state in response to a first state of the complementary data output signals, and set the output latch to a second output logic state in response to a second state of the data output signals. One or the other, but not both of the sense amplifiers change state in response to the complimentary data outputs received thereby during a memory read operation.

10 Claims, 5 Drawing Sheets

SENSE AMPLIFICATION IN DATA MEMORIES

BACKGROUND OF THE INVENTION

1. Field of the Invention

This invention relates to sense amplification in data memories.

2. Description of the Prior Art

Many random access memories (RAMs) use sense amplifiers for fast reading of stored data. This applies to dynamic RAM, static RAM, cache RAM and almost any embedded RAM structures which are designed for moderate to high speed.

In such memories, a part of a memory address supplied to the RAM is generally used to select and activate one of a plurality of rows of memory cells; the outputs of the memory cells in the activated row are connected in parallel via bit-lines to the inputs of the sense amplifiers.

A RAM read or write cycle may be initiated either by placing a new address on an address input of the RAM (which is usually the case for individual RAM chips) or by a transition in a clock or other control signal (which is generally the case for a RAM in an embedded controller device). A number of events then take place. Firstly, a state of RAM pre-charge is disabled, releasing the RAM from an idle condition and priming it for an active read or write operation. At the same time, or very shortly after, a row decoder starts to decode the input address, in order to generate a unique row-line output. For a medium sized RAM this may involve decoding eight address inputs to select one of 256 row control lines. After the row control line has been selected, all of the memory cells which are controlled by that row control line are activated, and those particular memory cells can be read-from or written-to.

In the case of a read cycle, the selected memory, cells begin to charge or discharge bit-lines connecting the memory cells to the respective sense amplifiers, and subsequently the charge currents or resulting voltage changes on the bit-lines are detected by the sense amplifiers. The outputs of the sense amplifiers (i.e. the data output of that row of the RAM) are written to the system or output data bus via a powerful buffer. Between the bit-lines and the sense amplifier there may also be a multiplexing stage (column decode) which further reduces the selection of RAM cells before presentation at the sense amplifier inputs, though this stage is often absent; column decoding is often enabled at the same time as row decoding.

The sense amplifiers are used to detect and amplify small changes in output (bit-line) current or voltage when a single RAM cell is enabled onto a bit-line, and they may take the form of current sensing amplifiers or voltage sensing amplifiers. Balance points are chosen to react quickly to small input changes; as a consequence the sense amplifiers are biassed with relatively large dc currents.

Once a sense amplifier has detected a small input change and amplified it to full logic levels, then some form of output device is required to propagate the RAM data. For a stand-alone dynamic or static RAM integrated circuit, this output device or driver may be an input/output pad which is designed to drive onto a printed circuit board in a data processing system. For an embedded cache or cache RAM, the output may be driven onto a common shared data-bus. In both cases the load capacitances are very high, and so the output buffer needs high current drive, which again implies a high power dissipation.

A further disadvantageous feature of sense amplifier operation is the power dissipated by pre-charge or equalisation "glitches" (transient spurious signals) applied to the output load capacitance of the sense amplifier. These glitches result from a common feature of fast sense amplifier designs known as "internal pre-charge", where the internal circuit nodes within tee sense amplifier are pre-set to a certain logic value, or equalised. Internal pre-charging leads to a rapid settling time when a new input is presented to the sense amplifier. However, a drawback of the use of internal pre-charging or equalisation is that the sense amplifier can initially output one value, and then quickly over-write it with a new value once sensing has taken place.

An example is illustrated by the case of a sense amplifier whose internal pre-charged value is logic-'0'. This means that if the RAM is in the idle phase and the sense amplifier is enabled at the beginning of a read cycle, then the amplifier will initially output a logic-'0'. Once recording is initiated, the sense amplifier inputs will change so that the output will be driven to either logic-'1' or logic-'0'. Clearly there is no problem if the final read value is logic-'0' because the sense amplifier has already produced that answer. However, the worst case is for a logic-'1' output, where initially the sense amplifier will output a logic-'0' due to the internal pre-charging, followed by a logic-'1' due to the presence of real data at the sense amplifier's inputs.

RAM output data are commonly latched to preserve output levels between successive read cycles, so if the old RAM value was logic-'1' and the new value is also logic-'1' then the output would pass through the rapid sequence of '1-0-1', where the logic-'0' level is a temporary glitch whose duration equals the interval between the time of turning on the sense amplifier and the time at which the new data are sensed.

The output glitch described above is clearly wasteful of power, particularly if the RAM outputs propagate the glitch to a high-capacitance printed circuit board or main system bus.

SUMMARY OF THE INVENTION

It is an object of the invention to avoid output glitches in data memories.

This invention provides a data memory comprising: a memory cell operable to generate two complementary data output signals indicative of a data bit stored in that memory cell; an output latch; a first sense amplifier associated with the memory cell, for setting the output latch to a first output state in response to a first state of the data output signals; and a second sense amplifier associated with the memory cell, for setting the output latch to a second output state in response to a second state of the data output signals.

The invention addresses the problem of output glitches described above by the counter-intuitive step of doubling the number of sense amplifiers used in the data memory. This can lead to overall power reduction by allowing better control of the RAM output stages.

The invention makes use of two sense amplifiers to read data stored in one memory cell, and employs an output latch whose output is set by a positive detection of a particular logical polarity of the stored data. The latch is only over-written when one or other of the sense amplifiers has positively responded to an input change, and therefore no glitch is propagated.

In one embodiment, one sense amplifier acts on positive input data from the memory cell and the other acts on negative input data from the memory cell. Both may be internally pre-charged or equalised to a certain logic-level, then when sensing is complete, either one or the other (but not both) of the sense amplifier outputs will have changed from the pre-charge level, depending on the input change. There is therefore some positive indication that sensing has been completed because one of the sense amplifier outputs must have changed from the initial idle state.

The skilled man will appreciate that the complementary output signals of the memory cell are not necessarily complementary except during an access cycle in which the data bit stored in the memory cell is accessed.

Preferably the data memory comprises a group of memory cells associated with the first sense amplifier and the second sense amplifier; and an address decoder, responsive to a memory address supplied to the data memory, for controlling one of the group of memory cells to generate respective data output signals. In this way, a pair of sense amplifiers can be shared between a large number of memory cells.

In order to provide a data memory for parallel storing data words comprising a plurality of bits, it is preferred that the data memory comprises a plurality of groups of memory cells; and a corresponding plurality of first and second sense amplifiers, each group of memory cells having an associated first sense amplifier and an associated second sense amplifier.

Preferably the data memory comprises means for pre-charging the data output signals of the memory cell to a predetermined state.

In order to make certain that no change to the output latch will be made during the interval mentioned above, it is preferred that the memory comprises means for pre-charging the first and second sense amplifiers to a non-latch-setting state.

Preferably a data buffer is connected to buffer the output of the output latch.

It is preferred that the data memory comprises means for disabling operation of the first and second sense amplifiers in response to the generation of the output signal by either one of the first and second sense amplifiers. Sense amplifiers are designed to be particularly fast and responsive to small changes in their inputs. This however has the corollary, that the sense amplifiers consume relatively large supply currents. Accordingly, this preferred feature recognises that in modern RAM designs, the sense amplifiers may complete the sensing of the state of the memory cell at a relatively early stage in a RAM read cycle. Maintaining operation of the sense amplifiers after the sensing has been completed can give rise to a considerable and unnecessary power drain.

This problem is addressed by arranging for operation of the sense amplifiers to be disabled (switched off) in response to the completion of the sensing operation. Thus, the high current consumption of the sense amplifiers is avoided during at least part of a RAM read cycle. By making the disabling of the sense amplifiers responsive to the completion of the sensing operation, the sense amplifier is thus 'self timed'. This avoids potential problems which might occur if the sense amplifier was turned off before completion of the sensing operation, e.g. at the end of a predetermined time period.

The skilled man will appreciate that the quiescent supply current of the sense amplifiers (i.e. the supply current when operation of the sense amplifier is disabled) need not necessarily be zero, but is considerably lower than the operational current of the sense amplifiers.

Further advantageous power savings can be achieved in an embodiment of the invention, in which the means for disabling is operable to disable operation of the memory cell in response to the generation of the output signal by the sense amplifier.

In order to allow output onto a shared data bus, it is preferred that the data buffer is a tri-state buffer; and the data memory comprises means for setting the data buffer from a high impedance output state to an output state indicative of the output signal generated by the sense amplifier, in response to the generation of the output signal by the sense amplifier. In this way the data buffer is not changed from a high impedance state until the sensing operation has been completed. However, advantageously, the data buffer can be made ready for output immediately after the sensing operation has been completed, using the same 'self timing' arrangement as that described above.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
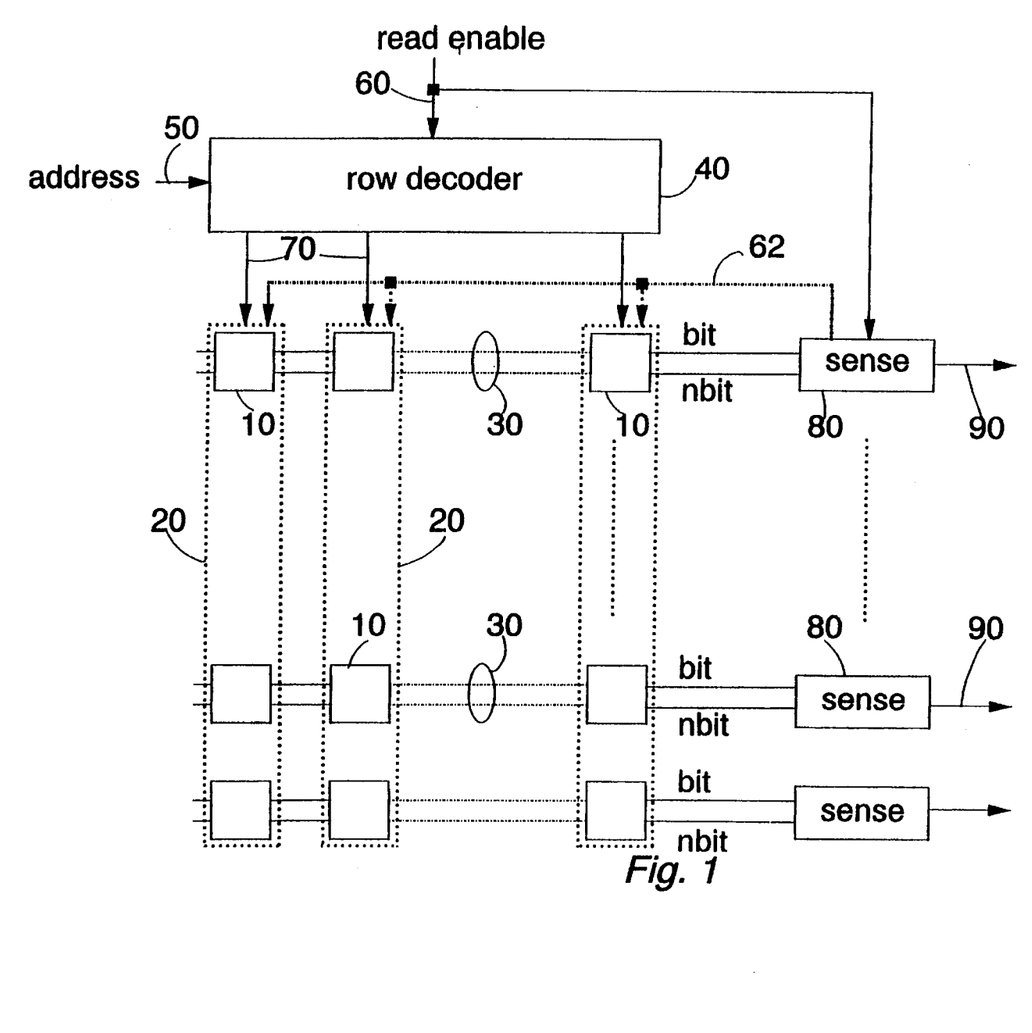
FIG. 1 is a schematic block diagram of a random access memory.

FIG. 1 is a schematic block diagram of a random access memory comprising an array of memory cells 10 arranged as a number of rows 20 of memory cells.

Each of the memory cells 10, when selected during a read operation, produces two output signals referred to as 'bit' and 'nbit'. The bit and nbit outputs of memory cells at corresponding positions in each of the rows 20 are connected to common signal lines 30, referred to as 'bit-lines'.

During a memory read operation, a row decoder 40 receives an address signal 50 specifying a single one of the rows 20 and, in response to the address signal 50 and a read enable signal 60, generates a single row enable signal 70 which enables one of the rows 20 of memory cells for a read operation. Thus, memory cells in the selected row place their respective bit and nbit outputs onto the bit-lines 30, and all other memory cells in unselected rows present a high impedance to the bit-lines 30.

The enabling of the rows of memory cells may also be under the control of a further row enable signal 62, to be described further below with reference to FIGS. 4 and 5. In that case, the signals 62 and 70 are combined in each row 20 by a logical AND operation (not shown), so that a row is enabled if both of the signals 62 and 70 are high. However, the row enable signal 62 is illustrated in broken line in FIG. 1, indicating that it is used in only some of the embodiments described herein.

The bit-lines 30 are connected to respective sense amplifier circuits 80. Between reading operations, the outputs (bit and nbit) of each memory cell 10 are pre-charged to a logical high state. When the selected row of memory cells is read, either the bit or the nbit output falls from the pre-charged high state to a low state (thereby indicating the storage of a logical one or a logical zero in that memory cell). However, because the two outputs of the memory cells 10 are connected to physically long bit-lines 30 having a high capacitance, the rate at which the outputs of the selected memory cells change is slow. For this reason, the sense amplifier circuits 80 amplify small changes in the bit-line voltage or current to detect which of the bit and nbit outputs is changing at an early stage. This increases the reading speed of the data memory.

A stage of column decode multiplexing (not shown) may be included between the memory cells and the sense amplifier circuits 80.

The sense amplifier circuits 80 generate an output signal 90 representing the stored bit in the corresponding memory cell 10 in the currently selected row 20. The sense amplifier circuits 80 incorporate a stage of tri-state buffering, which allows the output 90 to be connected to a shared system data bus (not shown).

Figure 2:
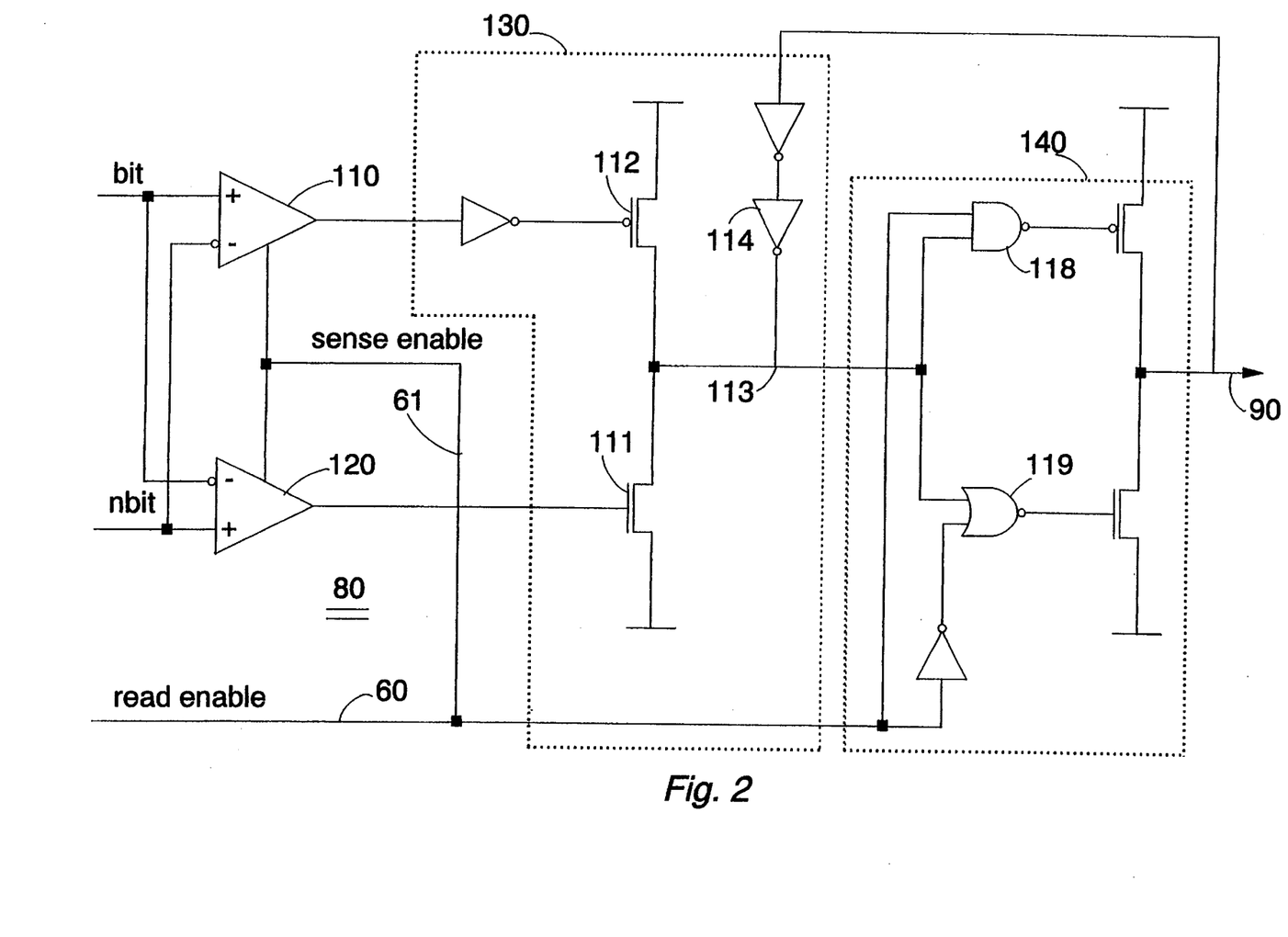
FIG. 2 is a schematic diagram of a sense amplifier circuit.

FIG. 2 is a schematic diagram of a sense amplifier circuit 80 incorporating a stage of tri-state buffering. In particular, FIG. 2 illustrates two sense amplifiers 110, 120, a latch circuit 130 and a tri-state buffer circuit 140. The circuitry illustrated in FIG. 2 receives the bit and nbit signals from a pair of bit-lines 30 and generates the buffered output signal 90 at its output. The output 90 is connected, with other tri-state buffered devices, to a common (shared) data bus.

The two sense amplifiers 110, 120 are enabled by a sense enable signal 61 identical to the read enable signal 60, and are connected in parallel with opposite polarities, so that the non-inverting input of the sense amplifier 110 is connected to the bit signal of the bit-lines 30, and the non-inverting input of the sense amplifier 120 is connected to the nbit signal. Both of the sense amplifiers 110, 120 are pre-charged to provide a fast response. This involves setting the internal nodes and the outputs of the sense amplifiers to a predetermined state before they are used in a read operation. In particular, the outputs of the sense amplifiers 110, 120 are pre-charged to a low logical state, with the output rising to a high logical state if the signal at the non-inverting input of that sense amplifier falls towards a low logical state. If the signal presented at the inverting input of a sense amplifier falls then the output of that sense amplifier remains at a low logical state.

Accordingly, since either bit or nbit (but not both) falls during a read operation, the output of only one of the sense amplifiers 110, 120 will rise to a high logical state during the read operation. The output of the other of the sense amplifiers will remain at a low logical state throughout. After the read operation, the bit and nbit signals return to a high logical state and the outputs of both sense amplifiers return to a low logical state.

The transient high level of one of the sense amplifier outputs sets the output of the latch circuit 130 to one of two possible states. In other words, the latch 130 is set to a new output by a positive detection that one of the bit and nbit signals is falling, rather than the data output depending on a spurious response resulting from pre-charging of the sense amplifiers.

The latch circuit 130 comprises two transistors 111, 112 and a feedback path from the output 90 to a node 113 at the output of the transistors 111, 112. The feedback path is formed by a pair of inverters, one of which (an inverter 114) is a so-called "weak" inverter. The weak inverter 114 is sufficiently weak that if the input to the transistor 112 goes to logic low, the logic high output of that transistor will override the output of the inverter 114 to force the node 113 high. Similarly, if the input to the transistor 111 goes to logic high, the logic low output of that transistor will override the output of the inverter 114 to force the node 113 low.

In the idle state of the sense amplifiers, the input to the transistor 111 is logic low and the input to the transistor 112 is logic high, so the weak inverter is not overridden. Conflicts do not arise in the latch circuit because the sense amplifiers cannot generate the situation where the input to the transistor 112 is low at the same time as the input to the transistor 111 is high.

The logical state of the node 113 therefore represents the previous state of the output 90 (which may be driven by other devices connected to the shared bus) until that output is overwritten with a new value by the sense amplifier circuit. Intermediate (glitch) outputs are not generated.

The output of the latch circuit 130 (at the node 113) is buffered by the tri-state buffer circuit 140 and presented as the buffered output 90, which in turn is fed back into the latch circuit as part of its operation.

The tri-state buffer circuit 140 is a conventional design comprising a logical-NAND gate 118, a logical-NOR gate 119 and a pair of output transistors. The circuit receives as an input the read enable signal, which is supplied as an input to the NAND gate 118 and, in inverted form, to the NOR gate 119.

If the read enable signal is high, then the NAND gate 118 and the NOR gate 119 are enabled and the buffered output 90 is identical to the logic level at the node 113. If the read enable signal is low, then the output of the NAND gate 118 is high and the output of the NOR gate 119 is low. These signals switch off (i.e. set to high impedance) the output transistors (a p-channel transistor and an n-channel transistor respectively) connected to the NAND gate 118 and the NOR gate 119. The output 90 is now not driven, which allows other tri-state buffers access to the common bus.

Figure 3:
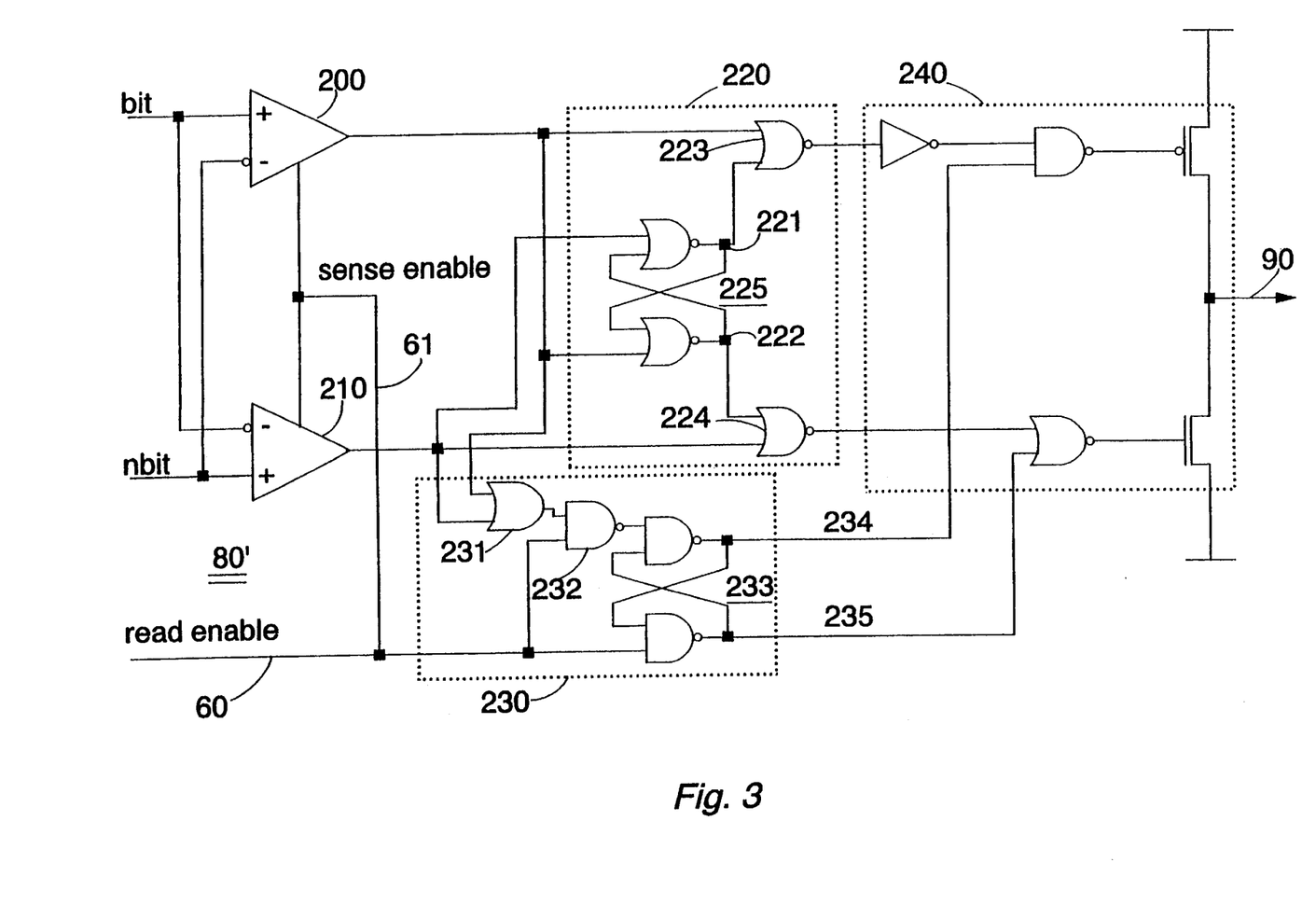
FIG. 3 is a schematic diagram of a second embodiment of a sense amplifier circuit.

FIG. 3 is a schematic diagram of a second embodiment of a sense amplifier circuit 80'.

The sense amplifier circuit 80' comprises two sense amplifiers 200, 210, a sense amplifier output latch 220, an output enable latch 230 and a tri-state buffer circuit 240. As with the circuitry of FIG. 2, the sense amplifier circuit 80' receives the bit and nbit signals from a pair of bit-lines 30 and generates the buffered output signal 90 at its output. The output 90 is connected, with other tri-state buffered devices, to a common (shared) data bus.

The sense amplifiers 200, 210 are connected in parallel with opposite polarities (as in FIG. 2) and have their outputs pre-charged to a low logical state. The output of a sense amplifier rises to a high logical state if the signal at the non-inverting input of that sense amplifier falls toward a low logical state.

Accordingly, if the signal on the 'bit' line falls (indicating that the memory cell under consideration stored a logical zero) then the output of the sense amplifier 200 rises and the output of the sense amplifier 210 remains low. Conversely, if the signal on the 'nbit' line falls (indicating that the memory cell under consideration stored a logical one) then the output of the sense amplifier 210 rises and the output of the sense amplifier 200 remains low.

As before, the sense amplifiers 200, 210 are enabled by a sense enable signal 61 identical to the read enable signal 60.

The respective outputs of the sense amplifiers 200, 210 are supplied in parallel as inputs to the sense amplifier output latch 220 and the output enable latch 230.

The sense amplifier output latch 220 comprises a flip-flop circuit 225 and a pair of NOR gates 223, 224. In the case where the memory cell stores a logical zero, the rising output of the sense amplifier 200 causes the flip-flop 225 to assume a state in which a node 221 is high and a node 222 goes low. The flip-flop outputs are combined with the sense amplifier outputs by the two NOR gates 223, 224. With the output of the sense amplifier 200 high, the output of the NOR gate 223 is low and the output of the NOR gate 224 is high. The outputs of the NOR gates 223 and 224 are supplied to the tri-state buffer circuit 240, which is of similar form to that described above with reference to FIG. 2.

In this way, the outputs of the sense amplifier output latch 220 (i.e. the outputs of the NOR gates 223, 224) reflect the detected state of the memory cell being sensed. If the output of the gate 223 is high and that of the gate 224 low, the state of the memory cell has been detected to be high, and vice versa.

The flip-flop circuit 225 therefore changes state only in response to one of the sense amplifier outputs rising. When both sense amplifiers 200, 210 are pre-charged (low), the previous state of the flip-flop circuit 225 remains valid. However, the previous state of the flip-flop circuit 225 is not output by the circuit 80'. This is because the output enable latch does not control the tri-state buffer circuit 240 to place a valid output onto the bus until the current state of the sense amplifier outputs has been detected.

As mentioned above, the respective outputs of the sense amplifiers 200, 210 are also supplied as inputs to the output enable latch 230, which receives the read enable signal 60 as a further input. The output enable latch 230 controls the tri-state buffer circuit 240 so that the sense amplifier circuit 80' produces an output 90 onto the shared data bus only when the content of the memory cell has been detected. In other words, the output enable latch 230 controls the tri-state buffer circuit 240 to remain in a high impedance output state until one of the sense amplifier outputs has risen to a high state.

The output enable latch 230 comprises an OR gate 231, which receives the sense amplifier outputs as its respective inputs, coupled to a NAND gate 232 and a flip-flop circuit 233. The outputs of the flip-flop circuit 233 are supplied as control inputs to the tri-state buffer 240.

When the sense amplifiers 200, 210 are pre-charged, their outputs are at a low logical state. The output of the OR gate 231 is therefore low and so the output of the NAND gate 232 is high. This forces the control output 234 low and the control output 235 high. As described above with reference to FIG. 2, this controls the tri-state buffer circuit 240 to assume a high impedance output state.

When the output of one of the sense amplifiers 200, 210 rises, the output of the OR gate 231 goes high. Assuming the read enable signal 60 is also high, the output of the NAND gate 232 goes low. This forces the control output 234 high and the control output 235 low. Again, as described above with reference to FIG. 2, these states of the control outputs 234, 235 enable the tri-state buffer circuit to provide a valid output 90 on the shared bus. The output 90 remains driven until the read enable signal 60 goes low again.

In either case, the tri-state buffer circuit 240 is not enabled for output (changed from a high impedance state) until one of the sense amplifier outputs has risen. This means that a valid output is not produced until the current state of the memory cell has been detected. In addition, the polarity of the output 90 reflects the respective outputs of the NOR gates 223, 224 and therefore the detected state of the memory cell.

Figure 4:
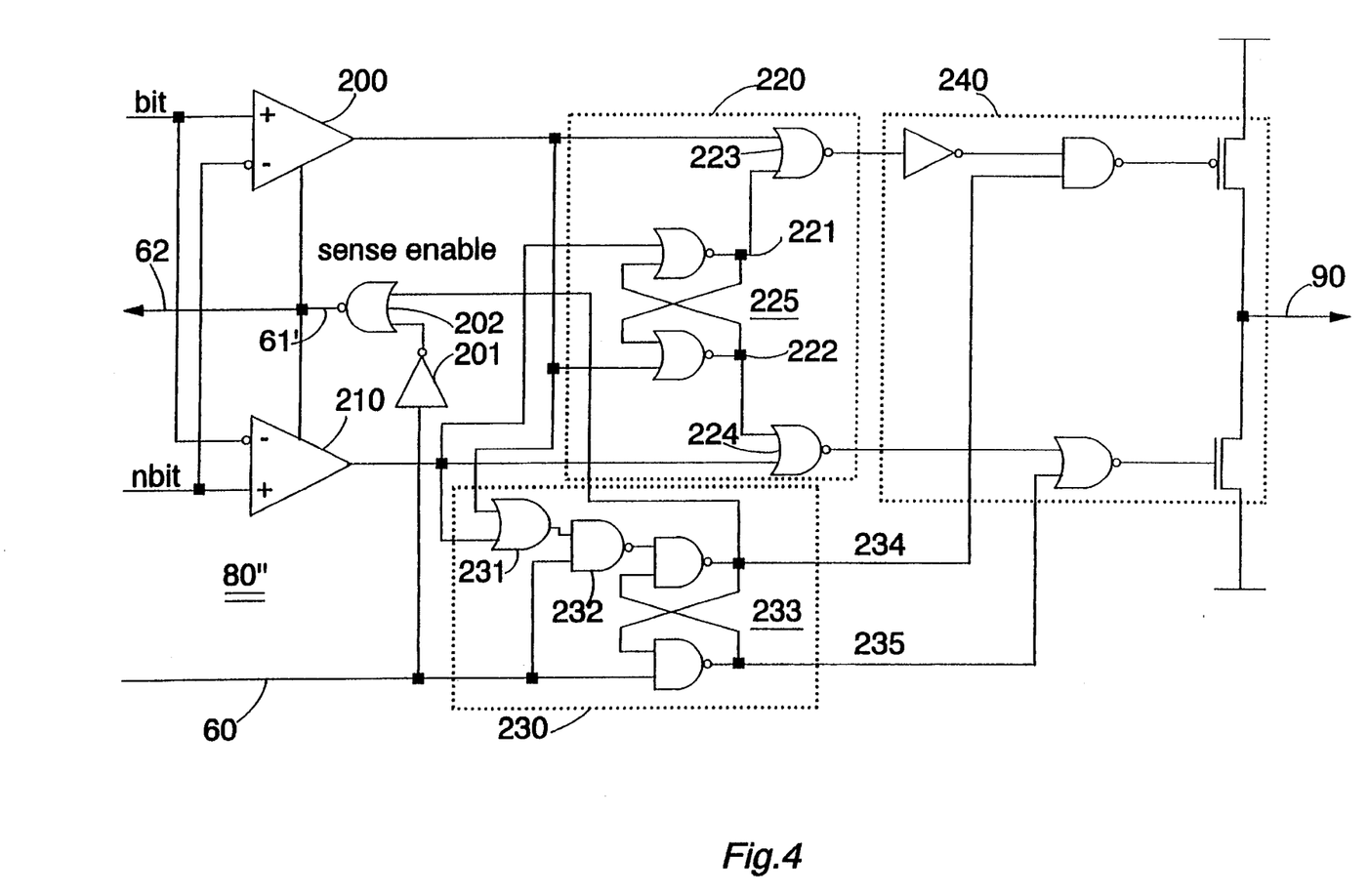
FIG. 4 is a schematic diagram of a third embodiment of a sense amplifier circuit.
Figure 5A:
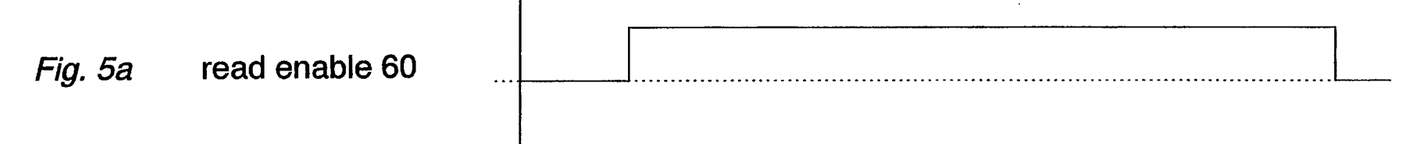
FIG. 5 is a timing diagram illustrating the operation of the sense amplifier circuit of FIG. 4.
Figure 5B:
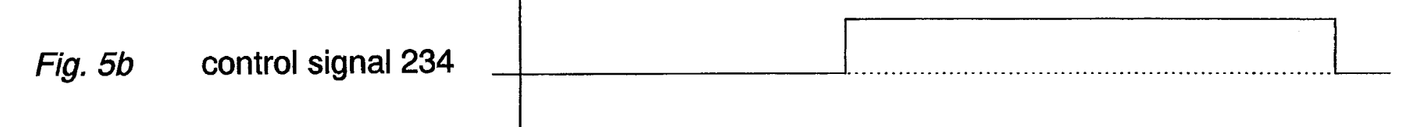
Figure 5C:
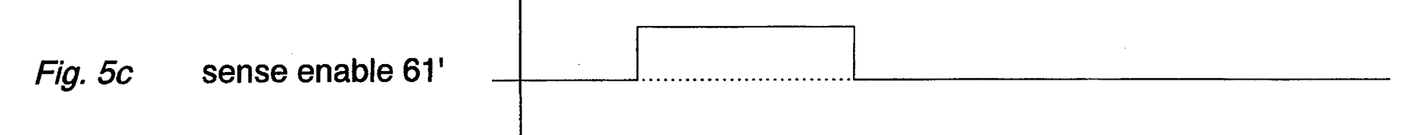
Figure 5D:
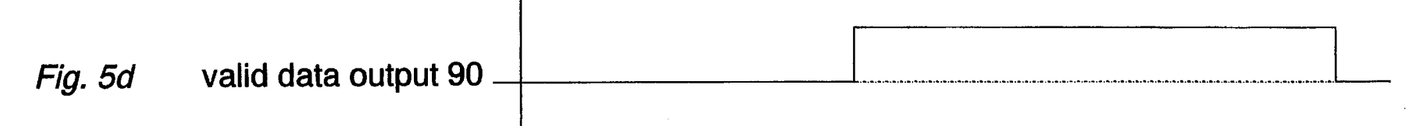

FIG. 4 is a schematic diagram of a third embodiment of a sense amplifier circuit 80".

The sense amplifier circuit 80" is similar in most respects to the sense amplifier circuit 80' of FIG. 3, except that in this case the sense enable signal 61' is derived from the read enable signal 60 and the output of the output enable latch 230.

The sense enable signal 61' is in fact derived by a logical combination of the read enable signal 60 and the control signal 234. In particular, the read enable signal 60 is inverted by an inverter 201, and the inverted signal is combined with the control output 234 by a NOR gate 202.

The sense enable signal is therefore enabled only when the read enable signal is high and the output 234 is low. During a read operation, when the output 234 rises, the sense amplifiers are disabled, thus reducing unnecessary power consumption of the circuit 80". However, this does not lead to incorrect sensing of the stored data because, as described above, the rising of the signal 234 does not take place until one of the sense amplifier outputs has risen, i.e. when the data has already been sensed. This means that the sense amplifiers are 'self timed', so that the time at which they are switched off is controlled to be immediately after they have completed their function of sensing the state of the bit-lines 30.

The sequence of operations of the circuit 80" is summarised by a schematic timing diagram shown in FIG. 5.

In FIG. 5, a RAM read operation is initiated by the read enable signal going high. Since at this stage the sense amplifiers 200, 210 are both pre-charged to a low output, the control output 234 is low. The combination of the low state of the control output 234 and the high state of the read enable signal 60 causes the sense amplifiers to be enabled by the seine enable signal 61'.

When the sense amplifiers have sensed the state of the bit-lines 30, i.e. when one of the sense amplifier outputs has risen, the sense amplifier output latch is set to store the sensed state of the bit-lines and the control signal 234 goes high. This has two effects: the tri-state buffer circuit 240 is enabled for output, and the sense amplifiers 200, 210 are switched off.

The tri-state buffer circuit 240 is finally switched off by the read enable signal returning to a low state at the end of the read cycle.

A further power reduction may also be achieved in this embodiment by forming the (optional) row enable signal 62 referred to above from the sense enable signal 61'. In this way, the currently selected row 20 of memory cells 10 is deselected when the sense enable signal falls (i.e. when the current states of the memory cells have been sensed). This can be performed by combining the respective row enable signals 62 from all of the sense amplifier circuits 80", so that the whole of the currently selected row is deselected only when all of the sense amplifier enable signals have fallen.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A data memory comprising:

a memory cell operable to generate two complementary data output signals indicative of a data bit stored in that memory cell;

an output latch;

a first sense amplifier associated with said memory cell, for setting said output latch to a first output state in response to a first state of said data output signals;

a second sense amplifier associated with said memory cell, for setting said output latch to a second output state in response to a second state of said data output signals; and means for disabling operation of said first and second sense amplifiers in response to the generation of said output signal by either one of said first and second sense amplifiers.

2. A data memory according to claim 1, in which said means for disabling is operable to disable operation of said memory cell in response to the generation of the output signal by either one of said first and second sense amplifiers.

3. A data memory comprising:

a memory cell operable to generate two complementary data output signals during read operation indicative of a data bit stored in that memory cell;

an output latch;

a first sense amplifier associated with said memory cell, for setting said output latch to a first output state in response to a first state of said data output signals;

a second sense amplifier associated with said memory cell, for setting said output latch to a second output state in response to a second state of said data output signals, only one of said first and second sense amplifiers changing output state during read operation.

4. A data memory according to claim 3, comprising means for pre-charging said data output signals of said memory cell to a predetermined state.

5. A data memory according to claim 3, comprising means for pre-charging said first and second sense amplifiers to a non-latch-setting state.

6. A data memory according to claim 3, comprising:

a group of memory cells associated with said first sense amplifier and said second sense amplifier; and an address decoder, responsive to a memory address supplied to said data memory, for controlling one of said group of memory cells to generate respective data output signals.

7. A data memory according to claim 6, comprising:

a plurality of groups of memory cells; and a corresponding plurality of first and second sense amplifiers, each group of memory cells having an associated first sense amplifier and an associated second sense amplifier.

8. A data memory according to claim 3, comprising a data buffer connected to buffer the output of said output latch.

9. A data memory according to claim 8, in which said buffer is a tri-state buffer.

10. A data memory according to claim 9, in which:

said data memory comprises means for setting said data buffer from a high impedance output state to an output state indicative of said output signal generated by said output latch, in response to the generation of said output signal by either one of said first and second seine amplifiers.

* * * * *